(12) United States Patent
Tunks et al.

(10) Patent No.: US 12,010,817 B2
(45) Date of Patent: Jun. 11, 2024

(54) METHOD AND SYSTEM FOR THERMAL EXCURSION MONITOR AND CONTROL

(71) Applicant: Dell Products L.P., Round Rock, TX (US)

(72) Inventors: Eric Michael Tunks, Austin, TX (US); Ayedin Nikazm, Austin, TX (US); Donald Wayne Gerhart, Leander, TX (US); Michael Joseph Stumpf, Cedar Park, TX (US)

(73) Assignee: DELL PRODUCTS L.P., Round Rock, TX (US)

( * ) Notice: Subject to any disclaimer, the term of this patent is extended or adjusted under 35 U.S.C. 154(b) by 269 days.

(21) Appl. No.: 17/578,148

(22) Filed: Jan. 18, 2022

(65) Prior Publication Data

US 2023/0232593 A1 Jul. 20, 2023

(51) Int. Cl.
*H05K 7/20* (2006.01)
*G06F 1/3206* (2019.01)
*G06F 1/3287* (2019.01)
*H05K 7/14* (2006.01)

(52) U.S. Cl.
CPC ........... *H05K 7/207* (2013.01); *G06F 1/3206* (2013.01); *G06F 1/3287* (2013.01); *H05K 7/1492* (2013.01)

(58) Field of Classification Search
CPC .. H05K 7/207; H05K 7/1492; H05K 7/20836; G06F 1/3287; G06F 1/20; G06F 1/206; G06F 1/189; G06F 1/3206

USPC .................................. 361/93.8, 103
See application file for complete search history.

(56) References Cited

U.S. PATENT DOCUMENTS

| | | | |
|---|---|---|---|
| 10,156,987 B1 * | 12/2018 | Gutierrez | G06F 1/3268 |
| 2011/0035606 A1 * | 2/2011 | Lovicott | G06F 1/206 |
| | | | 713/300 |
| 2011/0296155 A1 | 12/2011 | Belady et al. | |

OTHER PUBLICATIONS

International Search Report and Written Opinion mailed May 12, 2023, issued in corresponding PCT Application No. PCT/US2023/010747.

* cited by examiner

*Primary Examiner* — Danny Nguyen
(74) *Attorney, Agent, or Firm* — Chamberlain, Hrdlicka, White, Williams & Aughtry; Aly Z. Dossa

(57) ABSTRACT

A computing device includes a thermal excursion detection unit and a power supply unit. The thermal excursion detection unit is configured to monitor a temperature of an internal volume of the computing device and to control the operation of the power supply unit. The power supply unit is configured to provide power to hardware components in the computing device and the power supply unit only provides power to the hardware components when the thermal excursion detection unit permits.

16 Claims, 6 Drawing Sheets

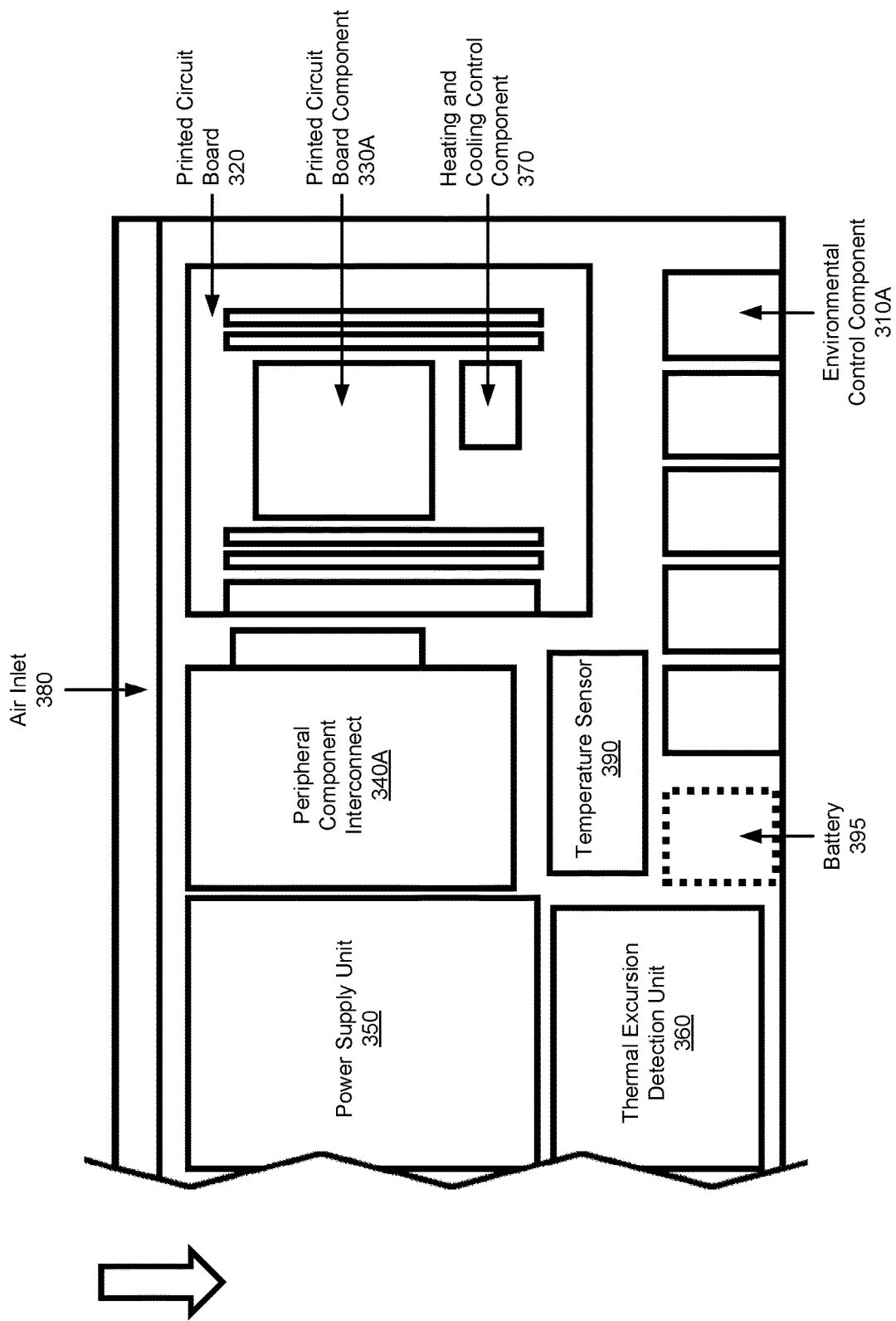
FIG. 3.1

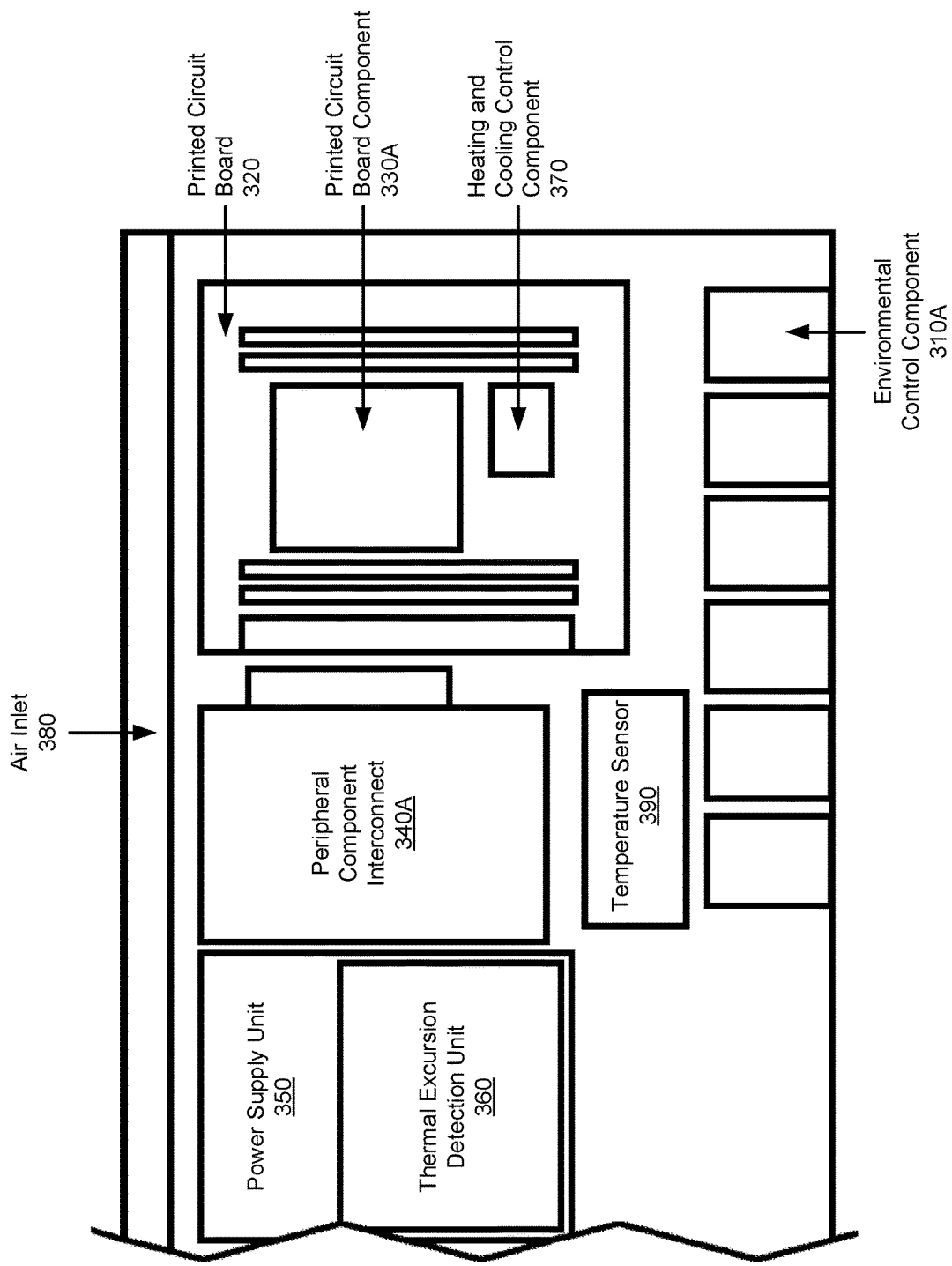
FIG. 3.2

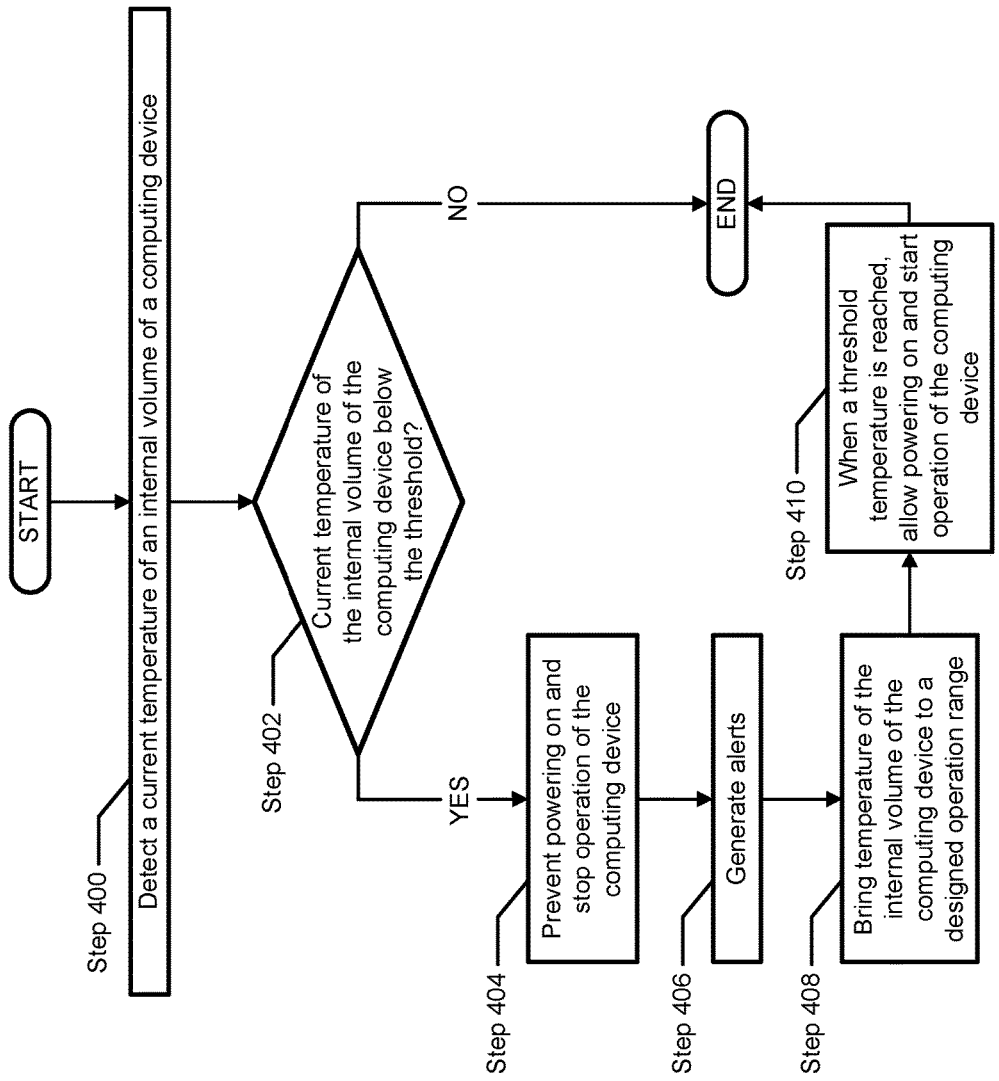
FIG. 4.1

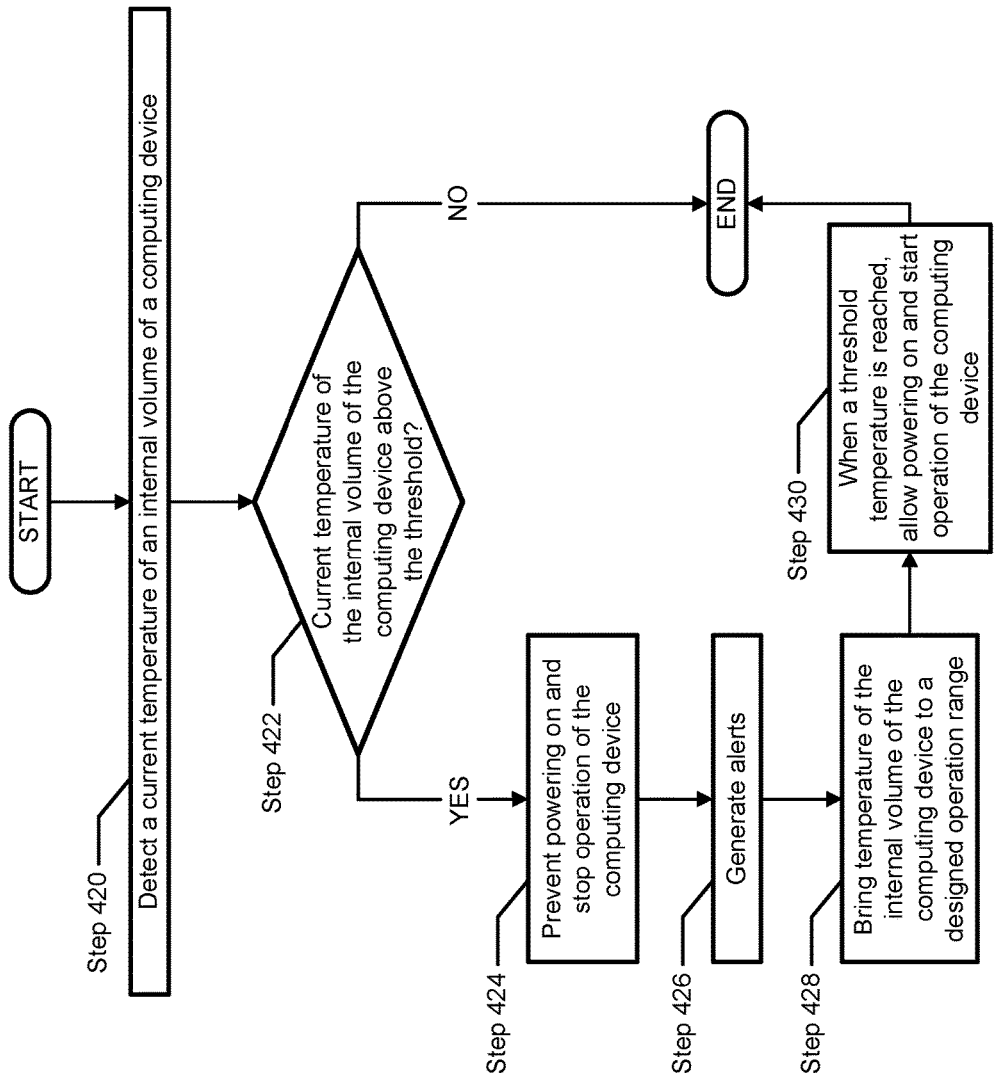
FIG. 4.2

METHOD AND SYSTEM FOR THERMAL EXCURSION MONITOR AND CONTROL

BACKGROUND

Computing devices may perform services. In order to provide the services, the computing devices may include hardware components and software components. The software components may utilize the hardware components to provide the services.

SUMMARY

In general, in one aspect, the invention relates to a computing device. The computing device includes a thermal excursion detection unit and a power supply unit. The thermal excursion detection unit is configured to monitor a temperature of an internal volume of the computing device and to control the operation of the power supply unit. The power supply unit is configured to provide power to hardware components in the computing device and the power supply unit only provides power to the hardware components when the thermal excursion detection unit permits.

In general, in one aspect, the invention relates to a method for thermal excursion monitor and control of an internal volume of a computing device. The method for thermal excursion monitor and control of the internal volume of the computing device may include detecting a current temperature of an internal volume of a computing device; making a determination, using the detected current temperature, that the current temperature of the internal volume of the computing device is below a threshold. In response to the determination, preventing a power supply unit to provide power to hardware components in the computing device and stopping operation of the computing device, and the power supply unit includes a thermal excursion detection unit.

In general, in one aspect, the invention relates to an information handling system including a cabinet housing a plurality of computing devices. Each computing device includes a thermal excursion detection unit and a power supply unit. The thermal excursion detection unit is configured to monitor a temperature of an internal volume of the computing device and to control the operation of the power supply unit. The power supply unit is configured to provide power to hardware components in the computing device and the power supply unit only provides power to the hardware components when the thermal excursion detection unit permits.

BRIEF DESCRIPTION OF DRAWINGS

Certain embodiments of the invention will be described with reference to the accompanying drawings. However, the accompanying drawings illustrate only certain aspects or implementations of the invention by way of example, and are not meant to limit the scope of the claims.

FIG. 3.1 shows a top-view of a portion of a computing device in accordance with one or more embodiments of the invention.

FIG. 3.2 shows a top-view of a portion of a computing device in accordance with one or more embodiments of the invention.

FIG. 4.1 shows a flowchart of a method for thermal excursion monitor and control of an internal volume of a computing device in accordance with one or more embodiments of the invention.

FIG. 4.2 shows a flowchart of a method for thermal excursion monitor and control of an internal volume of a computing device in accordance with one or more embodiments of the invention.

DETAILED DESCRIPTION

Figure 1:
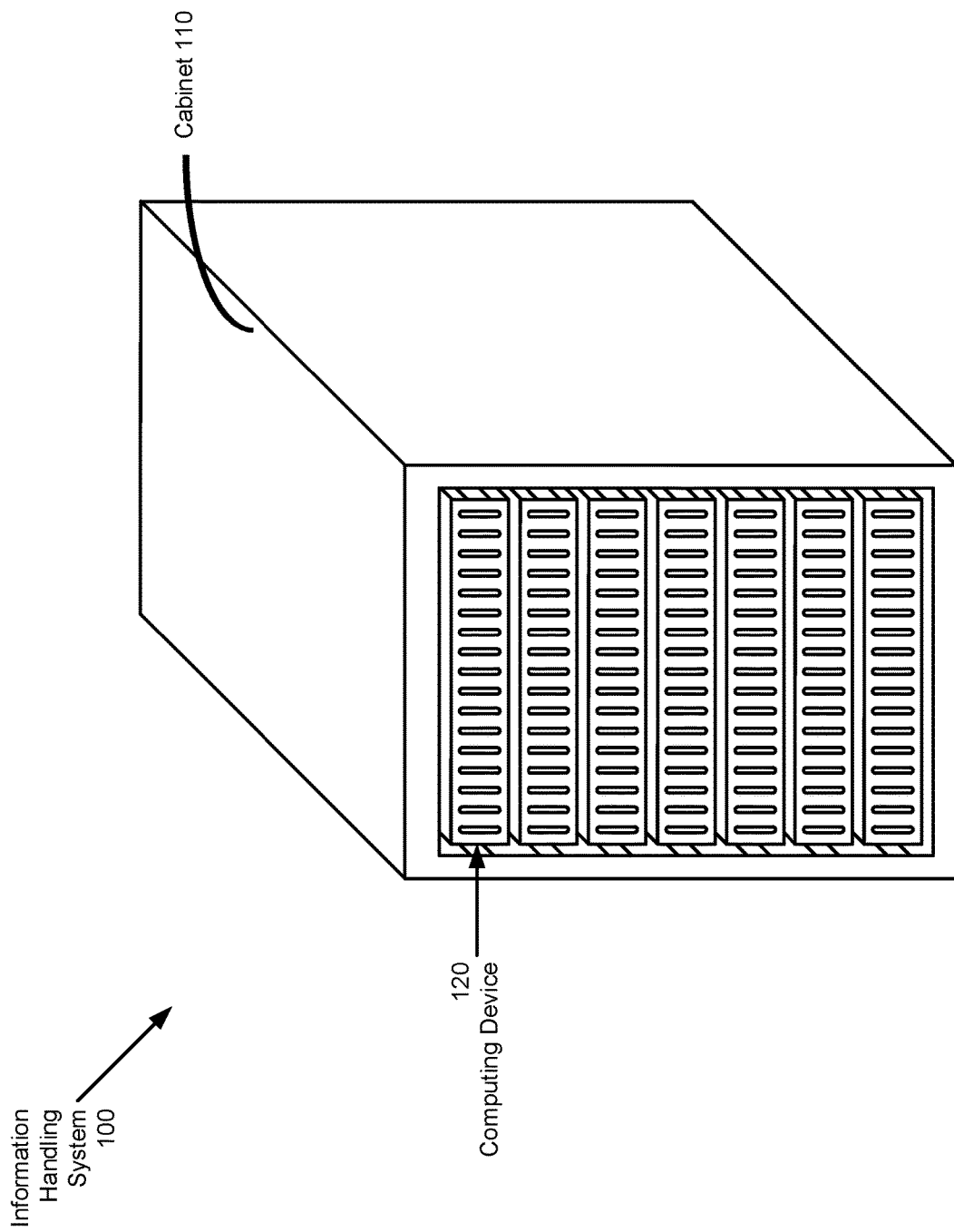
FIG. 1 shows a diagram of an information handling system in accordance with one or more embodiments of the invention.

Specific embodiments will now be described with reference to the accompanying figures. In the following description, numerous details are set forth as examples of the invention. It will be understood by those skilled in the art that one or more embodiments of the present invention may be practiced without these specific details, and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

As used herein, the phrase operatively connected, or operative connection, means that there exists between elements/components/devices a direct or indirect connection that allows the elements to interact with one another in some way. For example, the phrase 'operatively connected' may refer to any direct (e.g., wired directly between two devices or components) or indirect (e.g., wired and/or wireless connections between any number of devices or components connecting the operatively connected devices) connection. Thus, any path through which information and/or power may travel may be considered an operative connection.

Computing devices may include any number of hardware components that facilitate providing the services of the computing devices. The hardware components may include, for example, processors, non-persistent storage drives, persistent storage drives, circuit cards that interconnect these components, etc. In some cases, computing devices might be deployed in environments that result in the temperature of the computing devices being outside of their designed operating range. For example, the computing devices may be designed to operate at temperatures above 0° C. When the computing devices are deployed to harsh environmental conditions (e.g., −40° C. −60° C.), the computing devices may not operate properly and, in certain scenarios, may be damaged.

To address one or more of the aforementioned issues, embodiments of the invention provide a mechanism for thermal excursion monitor and control of an internal volume of a computing device. More specifically, embodiments of the invention include a thermal excursion detection unit that controls the output of a power supply unit in the computing device. Based on an input received from a temperature sensor within the computing device, the thermal excursion detection unit instructs a heating and cooling control component to manage a temperature of the internal volume of the computing device before powering the hardware components in the computing device.

Various embodiments of the computing device are described below.

FIG. 1 shows a diagram of an information handling system (100) in accordance with one or more embodiments of the invention. The system may include a cabinet (110) and any number of computing devices (e.g., 120).

The cabinet (110) may be a mechanical structure that enables computing devices (e.g., 120) to be positioned with respect to one another. For example, the cabinet (110) may be a rack mountable enclosure that enables the computing devices (e.g., 120) to be disposed within it. The cabinet (110) may be implemented as other types of structures adapted to house, position, orient, and/or otherwise physically, mechanically, electrically, and/or thermally manage the computing devices (e.g., 120). By managing the computing devices (e.g., 120), the cabinet (110) may enable multiple computing devices to be densely packed in a space without negatively impacting the operation of the information handling system (100).

A computing device (e.g., 120) may be a mechanical structure for housing components of the information handling system (100). For example, the computing device (e.g., 120) may be implemented as a rack mountable enclosure for housing components of the information handling system. The computing device (e.g., 120) may be adapted to be disposed within the cabinet (110) and/or utilize services provided by the cabinet (110) and/or other devices.

To provide services, the computing device (e.g., 120) may utilize computing device resources provided by hardware components. The hardware components may include, for example, processors, non-persistent storage drives, a printed circuited board(s), persistent storage drives, special purpose hardware, and/or other types of physical components that contribute to the operation of the computing device.

Figure 2:
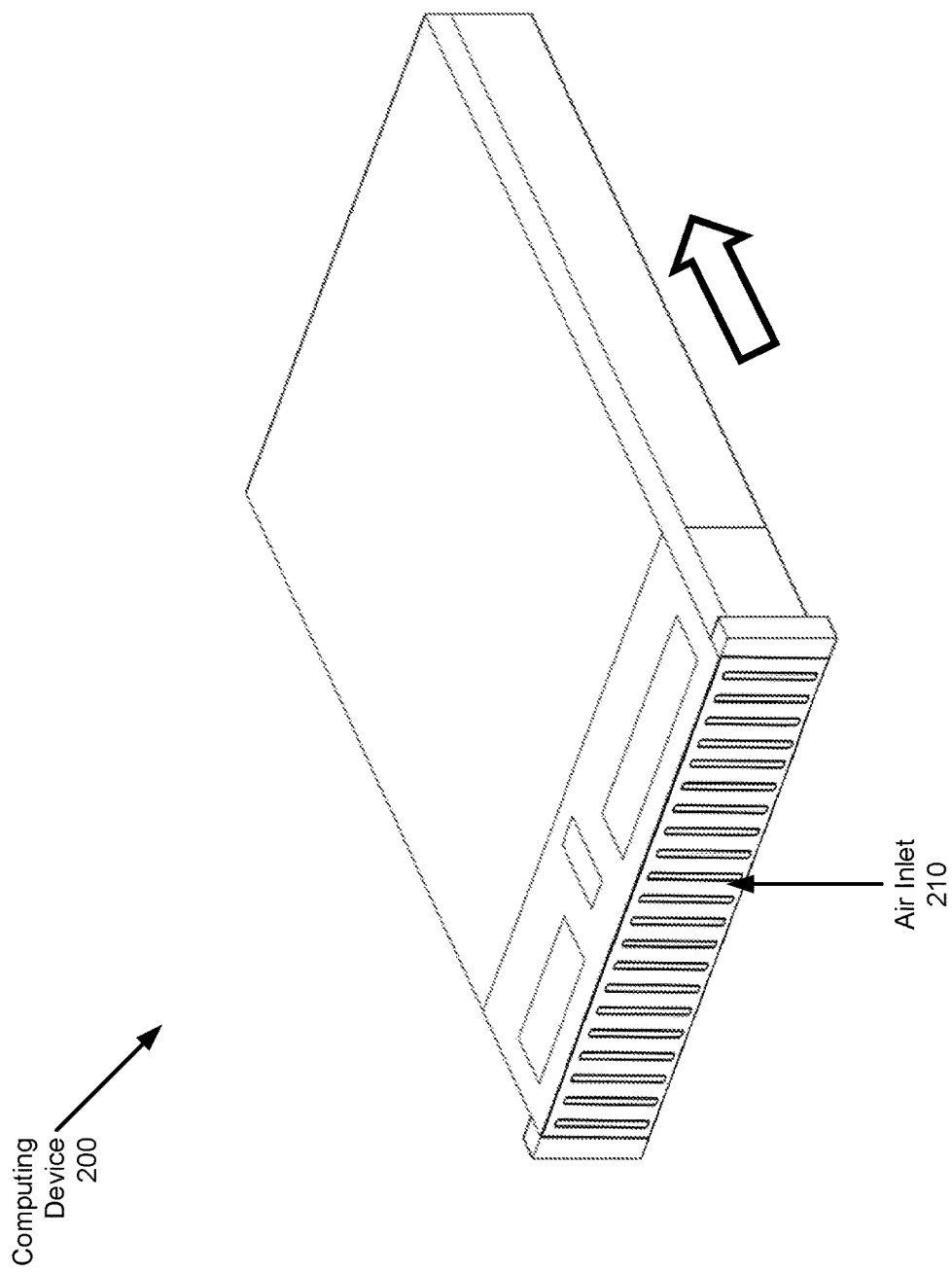
FIG. 2 shows a diagram of a computing device in accordance with one or more embodiments of the invention.

Turning now to FIG. 2, FIG. 2 shows a diagram of a computing device (200) in accordance with one or more embodiments of the invention. In one or more embodiments of the invention, the computing device includes six sides (i.e., top, bottom, right, left, front, and back), where air drawn into from the frontside of the computing device (i.e., via an air inlet (210)) and expelled from the backside of the computing device (i.e., via a number of environmental control components (e.g., 310A, FIG. 3.1)) (airflow direction is shown with an arrow). In general, air incoming from the frontside of the computing device is cooler than air outgoing from the backside of the computing device.

A thermal excursion detection unit (not shown) located in the computing device may improve stability and functionality of the computing device as it provides computer-implemented services in harsh environmental conditions. To provide services, the computing device (200) may utilize computing device resources provided by a number of hardware components housed within the computing device. The number of hardware components may include, for example, persistent storage drives (not shown), non-persistent storage drives (not shown), processors (not shown), peripheral component interconnects (not shown), a printed circuit board (not shown), and/or other types of physical components that contribute to the operation of the computing device (200). Some examples of the hardware components are shown in FIGS. 3.1 and 3.2, but the examples of the hardware components are not limited to those shown in FIGS. 3.1 and 3.2. In other embodiments, one or more of the hardware components may be omitted or additional hardware components may be added based on the services provided by the computing device.

FIGS. 3.1 and 3.2 show different embodiments to perform thermal excursion monitor and control of an internal volume of a computing device using a thermal excursion detection unit in accordance with one or more embodiments disclosed below.

Turning now to FIG. 3.1, FIG. 3.1 shows a top-view of a portion of a computing device in accordance with one or more embodiments of the invention. In one or more embodiments of the invention, the top-view of the portion of the computing device includes a number of environmental control components (e.g., 310A), a printed circuit board (320), a number of printed circuit board components (e.g., 330A), a number of peripheral component interconnects (e.g., 340A), a power supply unit (350), a thermal excursion detection unit (360), a heating and cooling control component (370), an air inlet (380), a temperature sensor (390), and a battery (395, shown with dotted lines). In an embodiment of the invention shown in FIG. 3.1, the airflow direction is shown with an arrow.

In one or more embodiments of the invention, the thermal excursion detection unit (360) is configured to control the operation of the power supply unit (350) and monitor a temperature of an internal volume of the computing device. The temperature sensor (390) is operatively connected to the thermal excursion detection unit, where the thermal excursion detection unit monitors the temperature of the internal volume of the computing device using the temperature sensor(s).

Those skilled in the art will appreciate that while the printed circuit board (320), the number of printed circuit board components (e.g., 330A), the number of peripheral component interconnects (e.g., 340A), the power supply unit (350), and the heating and cooling control component (370) are shown that they are located at the frontside of the computing device, those components may be placed at any location within the computing device without departing from the invention. Similarly, while the thermal excursion detection unit (360), temperature sensor (390), and the number of environmental control components (e.g., 310A) are shown that they are located at the backside of the computing device, those components may be placed at any location within the computing device without departing from the invention.

Continuing the discussion of FIG. 3.1, in one or more embodiments of the invention, the number of environmental control components (e.g., 310A) may include physical devices that provide functionality to alter characteristics (e.g., airflow directions, humidity and temperature levels, etc.) of the internal volume of the computing device (e.g., 200, FIG. 2) at a macroscopic level. For example, the number of environmental control components (e.g., 310A) may include gas movers such as fans. The fans may be able to change a rate of gases drawn into and expelled from the computing device.

In one or more embodiments of the invention, the heating and cooling control component (370) may provide heating or cooling control services. The heating or cooling control services may include (i) obtaining information regarding the temperature of one or more hardware components within the computing device (e.g., 200, FIG. 2), where the information may be obtained wirelessly or via the temperature sensor in the computing device, (ii) determining whether the temperature within the computing device is below or above the appropriate operating temperature range, (iii) initiating a heating process or a cooling process to bring the hardware components of the computing device into their designed operating temperature, and (iv) preventing damage to the hardware components in the computing device in the event of overheating or freezing.

The power supply unit (350) is configured to provide power to hardware components in the computing device. In one or more embodiments of the invention, the power supply unit is connected to a direct current (DC) or an alternating current (AC) input line and it has output lines that go to the hardware components to power them. The power supply unit only provides power to the hardware components when the thermal excursion detection unit (360) permits. The thermal excursion detection unit (360) permits power to be supplied to the hardware components when the internal volume of the computing device is within the designed operating range, where the internal volume of the computing device is brought into the designed operating range via a heating mechanism (not shown) or a cooling mechanism (not shown). In one or more embodiments of the invention, the thermal excursion detection unit (360) can control the power supply unit (350) by sending a signal.

In an embodiment of the invention shown in FIG. 3.1, the thermal excursion detection unit (360) is located outside of the power supply unit (350), where the thermal excursion detection unit and the temperature sensor (390) are powered by the battery (395) or the power supply unit.

In one or more embodiments of the invention, while illustrated as a physical structure, the thermal excursion detection unit (360) may be implemented as a logical entity (e.g., a program executing using a baseboard management controller (not shown) in the computing device). For example, the thermal excursion detection unit executes on the baseboard management controller. In such embodiments, the power supply unit provides power to the baseboard management controller and the temperature sensor (390).

In one or more embodiments of the invention, the baseboard management controller is a computing device (including its own processor (not shown), memory (not shown), and executes its own OS (not shown)) perform operations related to system management (e.g., of other hardware components) and/or monitors the status (e.g., "health") of other hardware components. Further, the baseboard management controller may be configured to communicate with other hardware components via one or more communication interfaces and protocols.

Turning now to FIG. 3.2, FIG. 3.2 shows a top-view of a portion of a computing device in accordance with one or more embodiments of the invention. In one or more embodiments of the invention, the top-view of the portion of the computing device includes a number of environmental control components (e.g., 310A), a printed circuit board (320), a number of printed circuit board components (e.g., 330A), a number of peripheral component interconnects (e.g., 340A), a power supply unit (350), a thermal excursion detection unit (360), a heating and cooling control component (370), an air inlet (380), and a temperature sensor (390).

In an embodiment of the invention shown in FIG. 3.2, the thermal excursion detection unit (360) is located inside of the power supply unit (350), where the thermal excursion detection unit and the temperature sensor (390) are powered by the power supply unit (395).

While FIGS. 3.1 and 3.2 show a set of powering mechanisms, any configuration of powering mechanisms at any location within the computing device may be used to provide the required power to the thermal excursion detection unit (360) for thermal excursion monitor and control of the internal volume of the computing device without departing from the invention. Those skilled in the art will appreciate that the thermal excursion detection unit (360) may be supplied with power, directly or indirectly, via one or more power supplies (not shown) within the computing device.

Turning now to FIG. 4.1, FIG. 4.1 shows a flowchart of a method for thermal excursion monitor and control of an internal volume of a computing device in accordance with one or more embodiments of the invention. The method shown in FIG. 4.1 may be performed by, for example, a thermal excursion detection unit (e.g., 360, FIG. 3.1). Other hardware components of the computing device illustrated in FIG. 3.1 may perform all, or a portion, of the method shown in FIG. 4.1 without departing from the invention.

While FIG. 4.1 is illustrated as a series of steps, any of the steps may be omitted, performed in a different order, additional steps may be included, and/or any or all of the steps may be performed in a parallel and/or partially overlapping manner without departing from the invention.

In Step 400, a current temperature of an internal volume of a computing device is detected. In one or more embodiments of the invention, the current temperature of the internal volume of the computing device may be detected through a temperature sensor, which is operatively connected to at least one of the hardware components within the computing device.

In Step 402, a determination is made about whether the current temperature of the internal volume of the computing device is outside the designed operating range (i.e., below a threshold). For example, if the designed operating range is 0° C.-40° C., then the threshold may be −1° C. If the result of the determination is YES, which indicates the current temperature of the internal volume of the computing device is below the threshold, the method proceeds to Step 404. If the result of the determination is NO, which indicates the current temperature of the internal volume of the computing device is not below the threshold, the method ends.

In Step 404, powering on a number of hardware components (e.g., 320, 330A, 340A, etc., FIG. 3.2) of the computing device is prevented. In one or more embodiments of the invention, the power supply unit provides power to the thermal excursion detection unit and the temperature sensor. Further, the thermal excursion detection unit instructs the power supply unit to not provide power to the hardware components when the current temperature of the internal volume of the computing device is below the threshold. In this manner, possible damage to the hardware components in the computing device can be prevented in the event that there is an attempt to power-on the computing device that has an internal temperature below its operating range.

In one or more embodiments of the invention, the battery provides power to the thermal excursion detection unit and the temperature sensor when the power supply unit does not provide power to the thermal excursion detection unit and the temperature sensor. Those skilled in the art will appreciate that while the battery provides power to the thermal excursion detection unit and the temperature sensor, any kind of power supply (e.g., supercapacitor) may be used to power the thermal excursion detection unit and the temperature sensor without departing from the invention.

In Step 406, alerts and/or notifications are generated. In one or more embodiments of the invention, the alerts and/or notifications are generated by the thermal excursion detection unit to indicate that the temperature of the internal volume of the computing device is outside the designed operating range. The alerts and/or notifications can be generated in the form of, for example, a viewable light emitting diode (LED). Further, the alerts and/or notifications can be directed to the corresponding party via wired and/or wireless connections.

Those skilled in the art will appreciate that while the alerts and/or notifications are generated in the form of LED, any configuration of alerts and/or notifications may be used to generate required warnings in advance without departing from the invention.

Continuing with the discussion of FIG. 4.1, in Step 408, the temperature of the internal volume of the computing device is brought into its designed operating range. In one or more embodiments of the invention, the temperature of the internal volume of the computing device is brought into its designed operating range by a heating and cooling control component. The thermal excursion detection unit instructs the power supply unit to selectively provide power to the heating and cooling control component when the internal volume of the computing device is outside the designed operating range.

While Step 408 describes an example to bring the temperature of the internal volume of the computing device into its designed operating range, any configuration at any location within the computing device may be used to provide equilibrium operation condition for the hardware components of the computing device without departing from the invention.

In Step 410, when the internal volume of the computing device is within the designed operating range (e.g., when a threshold temperature is reached), the thermal excursion detection unit instructs the power supply unit to provide power to the hardware components (e.g., 320, 330A, 340A, etc., FIG. 3.2) and allow the computing device to initiate operation. Prior to Step 410, only a limited number of components within the computing device are operating (i.e., powered-on) in order to perform Steps 400-408. By this way, the computing device will continue to provide computer-implemented services in the harsh environmental conditions.

The method ends following Step 410.

In one or more embodiments, with the help of Steps 404-410, thermal excursion monitor and control of the internal volume of the computing device is performed. The output of the power supply unit is managed to prevent powering of the number of hardware components in the computing device before the temperature of the internal volume of the computing device is brought to the designed operating range. Further, the stability and functionality of the computing device are improved.

Turning now to FIG. 4.2, FIG. 4.2 shows a flowchart of a method for thermal excursion monitor and control of an internal volume of a computing device in accordance with one or more embodiments of the invention. The method shown in FIG. 4.2 may be performed by, for example, the thermal excursion detection unit (e.g., 360, FIG. 3.1). Other hardware components of the computing device illustrated in FIG. 3.1 may perform all, or a portion, of the method shown in FIG. 4.2 without departing from the invention.

While FIG. 4.2 is illustrated as a series of steps, any of the steps may be omitted, performed in a different order, additional steps may be included, and/or any or all of the steps may be performed in a parallel and/or partially overlapping manner without departing from the invention.

In Step 420, the current temperature of an internal volume of the computing device is detected. In one or more embodiments of the invention, the current temperature of the internal volume of the computing device may be detected through the temperature sensor, which is operatively connected to at least one of the hardware components within the computing device.

In Step 422, a determination is made about whether the current temperature of the internal volume of the computing device is outside the designed operating range (i.e., above a threshold). For example, if the designed operating range is 0° C.–40° C., then the threshold may be 41° C. If the result of the determination is YES, which indicates the current temperature of the internal volume of the computing device is above the threshold, the method proceeds to Step 404. If the result of the determination is NO, which indicates the current temperature of the internal volume of the computing device is not above the threshold, the method ends.

In Step 424, power is no longer provided to a number of hardware components (e.g., 320, 330A, 340A, etc., FIG. 3.2) of the computing device resulting in the operation of the computing device being stopped or suspended. Step 424 may involve gracefully shutting down the hardware components as opposed to abruptly ceasing to provide power to the one or more hardware components. While power is no longer provided to various hardware components in the computing device, the power supply unit continues to selectively provide power to the thermal excursion detection unit and the temperature sensor. Further, the thermal excursion detection unit instructs the power supply unit to not provide power to the hardware components when the current temperature of the internal volume of the computing device is above the threshold. With this way, possible damages to the hardware components in the computing device can be prevented in the event of overheating.

In Step 426, alerts and/or notifications are generated. In one or more embodiments of the invention, the alerts and/or notifications are generated by the thermal excursion detection unit to indicate that the temperature of the internal volume of the computing device is outside the designed operating range. The alerts and/or notifications can be generated in the form of, for example, a viewable light emitting diode (LED). Further, the alerts and/or notifications can be directed to the corresponding party via wired and/or wireless connections.

Those skilled in the art will appreciate that while the alerts and/or notifications are generated in the form of LED, any configuration of alerts and/or notifications may be used to generate required warnings in advance without departing from the invention.

Continuing with the discussion of FIG. 4.2, in Step 428, the temperature of the internal volume of the computing device is brought into its designed operating range. In one or more embodiments of the invention, the temperature of the internal volume of the computing device is brought into its designed operating range by the heating and cooling control component. The thermal excursion detection unit instructs the power supply unit to selectively continue to provide power to the heating and cooling control component when the internal volume of the computing device is outside the designed operating range.

While Step 428 describes an example to bring the temperature of the internal volume of the computing device into its designed operating range, any configuration at any location within the computing device may be used to provide equilibrium operation condition for the hardware components of the computing device without departing from the invention.

In Step 430, when the internal volume of the computing device is within the designed operating range (e.g., when a threshold temperature is reached), the thermal excursion detection unit instructs the power supply unit to provide power to the hardware components and allow the operation of the computing device to restart or resume (if it was suspended). In this manner, the computing device will continue to provide computer-implemented services in the harsh environmental conditions.

The method ends following Step 430.

In one or more embodiments, with the help of Steps 424-430, thermal excursion monitor and control of the internal volume of the computing device is performed. The output of the power supply unit is managed to prevent powering of the number of hardware components in the computing device before the temperature of the internal volume of the computing device is brought to the designed operating range. Further, the stability and functionality of the computing device are improved.

In one embodiment of the invention, the computing device may implement the method shown in FIG. 4.1 and the method shown in FIG. 4.2.

The problems discussed above should be understood as being examples of problems solved by embodiments of the invention disclosed herein and the invention should not be limited to solving the same/similar problems. The disclosed invention is broadly applicable to address a range of problems beyond those discussed herein.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A computing device, comprising:
a thermal excursion detection unit, wherein the thermal excursion detection unit is configured to monitor a temperature of an internal volume of the computing device and to control the operation of a power supply unit;
the power supply unit is configured to provide power to hardware components in the computing device, wherein the power supply unit only provides power to the hardware components when the thermal excursion detection unit permits; and
a baseboard management controller, wherein the thermal excursion detection unit executes on the baseboard management controller, wherein the power supply unit comprises the thermal excursion detection unit, wherein the power supply unit provides power to the baseboard management controller, wherein the hardware components do not comprise the baseboard management controller.

2. The computing device of claim 1, further comprising:
a temperature sensor operatively connected to the thermal excursion detection unit, wherein the thermal excursion detection unit monitors the temperature of the internal volume of the computing device using the temperature sensor.

3. The computing device of claim 1, wherein the power supply unit provides power to the thermal excursion detection unit and a temperature sensor, wherein the hardware components do not comprise the thermal excursion detection unit and the temperature sensor.

4. The computing device of claim 2, further comprising:
a battery, wherein the battery provides power to the thermal excursion detection unit and the temperature sensor, wherein the power supply unit does not provide power to the thermal excursion detection unit and the temperature sensor.

5. The computing device of claim 2, further comprising:
a supercapacitor, wherein the supercapacitor provides power to the thermal excursion detection unit and the temperature sensor, wherein the power supply unit does not provide power to the thermal excursion detection unit and the temperature sensor.

6. The computing device of claim 1, wherein the thermal excursion detection unit is further configured to generate alerts to indicate that the temperature of the internal volume of the computing device is outside a designed operating range.

7. The computing device of claim 1, wherein the thermal excursion detection unit instructs the power supply unit to provide power to the hardware components when the internal volume of the computing device is within a designed operating range.

8. The computing device of claim 1, wherein the thermal excursion unit instructs the power supply unit to not provide power to the hardware components when the internal volume of the computing device is outside a designed operating range.

9. The computing device of claim 8, further comprising:
a heating and cooling control component,
wherein the thermal excursion unit instructs the power supply unit to provide power to the heating and cooling component when the internal volume of the computing device is outside the designed operating range.

10. A method for thermal excursion monitor and control of an internal volume of a computing device, comprising:
detecting a current temperature of an internal volume of a computing device via a temperature sensor that is operatively connected to a hardware component of the computing device;
making a determination, using the detected current temperature, that the current temperature of the internal volume of the computing device is below a threshold; and
in response to the determination:
preventing a power supply unit to provide power to hardware components in the computing device and stopping operation of the computing device, wherein the power supply unit comprises a thermal excursion detection unit,
wherein, in order to prevent a damage to each of the hardware components, the thermal excursion detection unit instructs the power supply unit not to provide power to the hardware components comprising at least the thermal excursion detection unit and the temperature sensor, and
wherein, when the power supply unit does not provide power to the thermal excursion detection unit and the temperature sensor, a battery of the computing device provides power to the thermal excursion detection unit and the temperature sensor.

11. The method of claim 10, further comprising:
based on the determination:
generating alerts; and
bringing a temperature of the internal volume of the computing device to a designed operating range.

12. The method of claim 10, further comprising:
detecting the current temperature of the internal volume of the computing device;
making a second determination, using the detected current temperature, that the current temperature of the internal volume of the computing device is above a threshold;
in response to the second determination:
preventing the power supply unit to provide power to the hardware components in the computing device and stopping operation of the computing device, wherein the power supply unit comprises the thermal excursion detection unit.

13. The method of claim 12, further comprising:
based on the determination:
generating alerts; and
bringing a temperature of the internal volume of the computing device to a designed operating range.

14. An information handling system, comprising:
a cabinet housing a plurality of computing devices;
the plurality of computing devices, wherein each of the computing devices comprises:
a thermal excursion detection unit, wherein the thermal excursion detection unit is configured to monitor a temperature of an internal volume of the computing device and to control the operation of a power supply unit;
a temperature sensor operatively connected to the thermal excursion detection unit, wherein the thermal excursion detection unit monitors the temperature of the internal volume of the computing device using the temperature sensor;
a battery, wherein the battery provides power to the thermal excursion detection unit and the temperature sensor, wherein the power supply unit does not provide power to the thermal excursion detection unit and the temperature sensor; and
the power supply unit is configured to provide power to hardware components in the computing device, wherein the power supply unit only provides power to the hardware components when the thermal excursion detection unit permits.

15. The information handling system of claim 14, wherein the power supply unit comprises the thermal excursion detection unit.

16. The information handling system of claim 15, wherein the power supply unit provides power to the thermal excursion detection unit and a temperature sensor, wherein the hardware components do not comprise the thermal excursion detection unit and the temperature sensor.

* * * * *